United States Patent [19]

Arnold et al.

[11] Patent Number: 4,977,393

[45] Date of Patent: Dec. 11, 1990

[54] METHOD AND APPARATUS FOR MONITORING THE CONDITION OF CHARGE OF A BATTERY CONNECTED TO AN APPLIANCE AND INCLUDING COUNTERS COUNTED WITH RESPECT TO THE TIME AND DRAIN OF THE BATTERY

[75] Inventors: Werner Arnold, Nuremberg; Peter Grundl, Erlangen, both of Fed. Rep. of Germany

[73] Assignee: Diehl GmbH & Co., Nuremberg, Fed. Rep. of Germany

[21] Appl. No.: 364,072

[22] Filed: Jun. 8, 1989

[30] Foreign Application Priority Data

Jul. 7, 1988 [DE] Fed. Rep. of Germany ....... 3823038

[51] Int. Cl.⁵ .............................................. G08B 21/00
[52] U.S. Cl. ..................................... 340/636; 320/48; 320/34; 320/31
[58] Field of Search ................ 340/636; 324/427, 428, 324/436; 320/31, 33, 34, 39, 44, 45, 47, 48

[56] References Cited

U.S. PATENT DOCUMENTS

| 3,898,548 | 8/1975 | Perelle et al. | 324/428 |
| 4,525,055 | 6/1985 | Yokoo | 340/636 |
| 4,661,759 | 4/1987 | Klein | 320/45 |
| 4,679,000 | 7/1987 | Clark | 324/428 |
| 4,743,831 | 5/1988 | Young | 340/636 |
| 4,914,393 | 4/1990 | Yoshido | 324/428 |

Primary Examiner—Joseph A. Orsino
Assistant Examiner—Jill Jackson
Attorney, Agent, or Firm—Scully, Scott, Murphy & Presser

[57] ABSTRACT

A method and apparatus for monitoring the state or condition of charge of a battery which supplies a plurality of electrical consumption devices in an electronic circuit. A consumption device is operatively connected to a series of counters so that the count condition charges in response to a pulsing rhythmic cycle by one of a plurality of numerical values toward a final count condition, in which the numerical values are specific in relation to the power consumptions of a plurality of electrical consumption devices, and that a signal is generated upon the reaching of a final count condition.

4 Claims, 1 Drawing Sheet

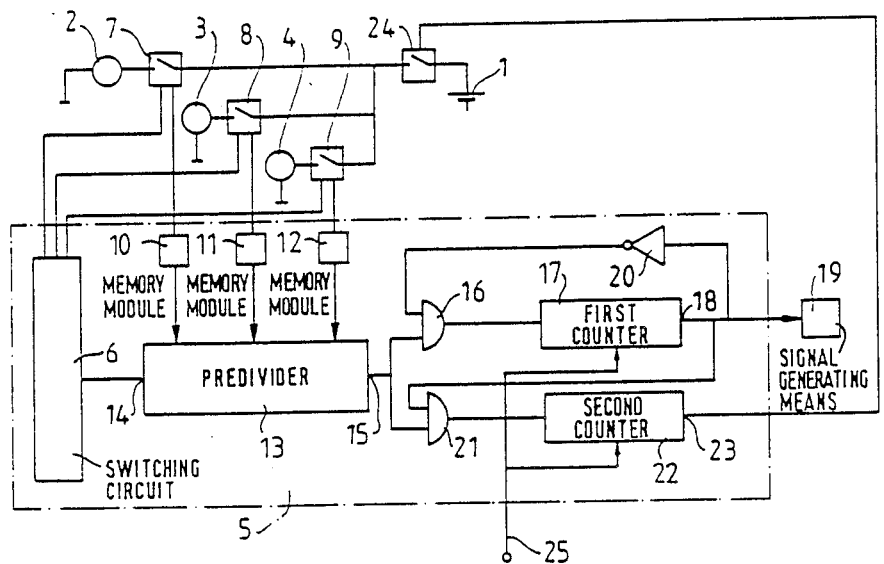

METHOD AND APPARATUS FOR MONITORING THE CONDITION OF CHARGE OF A BATTERY CONNECTED TO AN APPLIANCE AND INCLUDING COUNTERS COUNTED WITH RESPECT TO THE TIME AND DRAIN OF THE BATTERY

BACKGROUND OF THE INVENTION

1. Field of the Invention

The present invention relates to a apparatus for monitoring the state or condition of the charge of a battery which supplies a plurality of electrical consumption devices in an electronic circuit.

2. Discussion of the Prior Art

Electronic appliances or equipment usually possess various kinds of electrical users or consumption devices; for example, such as relays, oscillators or buzzers, and optical displays among others. Such devices can be either battery-powered, or can be equipped with a battery serving as an emergency battery in the event of a power failure. In order to ensure the ability of operation of the appliance, there is provided means for controlling the condition of the charge of the battery. In accordance with the current state-of-the-technology, this is accomplished in that, for example, the battery voltage is monitored. This method is precise, nevertheless, as such it is complicated and expensive.

SUMMARY OF THE INVENTION

Accordingly, it is an object of the present invention to provide a method and apparatus of the above-mentioned type through which it is possible to monitor the state of the charge of the battery in an electronic appliance through consideration being given to the actual duration of operative connection and the power drawn by the consumption devices of the appliance.

Inventively, the above-mentioned object is attained in that a counter is set to an initial count condition at a fully-charged condition of the battery, in which the conditions of the operatively-connected consumption devices are scanned in a pulsing or rhythmic cycle, wherein a consumption device is operatively connected for such a time period that the count condition in the rhythmic cycle is changed by one of a plurality of numerical values in a direction toward a final count condition, in which the numerical values are specific in relation to the power consumption of the electrical consumption devices, and a signal is generated upon the reaching of a final count condition.

In view of the foregoing, it is possible to achieve that, as the criterium for ascertaining the state of charge of the battery, there is not employed the voltage of the battery, but rather the actual consumption of the charge. The method and apparatus of the invention is so constructed so as to be implemented in a simple manner in electronic circuits; for instance, also in a microprocessor, inasmuch as, on the one hand, it operates purely digitally, and on the other hand, there is no need to carry out any computations, since there is merely a change in a count condition.

BRIEF DESCRIPTION OF THE DRAWINGS

Advantageous embodiments of the invention can now be readily ascertained from the following detailed description of an exemplary embodiment thereof; taken in conjunction with accompanying single figure of drawing illustrating a block circuit diagram of circuitry for monitoring the state of charge of a battery.

DETAILED DESCRIPTION OF THE PREFERRED EMBODIMENTS

An electronic appliance posseses a battery 1. Connected to this battery, in the illustrated example, are three users or electrical consumption devices 2, 3, 4 and an electronic circuit 5 of the appliance. The electronic circuit 5 incorporates a control or switching circuit 6, which connects or disconnects the devices or users 2, 3, 4 through the intermediary of switches 7, 8, 9.

The power outputs of the consumption devices 2, 3, 4 are different from each other. Thus, for example, they stand in the ratio of 1:2:3. The numerical values which correspond to these power output or consumption ratios are stored in memory storage modules 10, 11, 12.

The storage or memory modules 10, 11, 12 are respectively connected with the switches 7, 8 and 9, and activated when the applicable switch 7, 8, 9 is closed; in essence, when the associated consumption device 2, 3, 4 is operatively connected thereto. The memory or storage modules 10, 11, 12 are connected to a predivider 13 to whose input 14 there is applied the pulse which is already present in the control or switching circuit 6. For example, one pulse per second is applied to the input 14.

Connected to the output 15 of the predivider 13 is a counter 17 across an AND gate 16. A signal generator 19 is connected to the output 18 of the counter 17. Moreover, the output 18 is connected across an inverter 20 to the AND gate 16 and directly connected to a further AND gate 21. At the AND gate 21 there is also connected the output 15 of the predivider 13. A further counter 22 is connected to the output of AND gate 21. Connected to this output 23 of counter 22 is a main switch 24 which is connected to the output of the battery 1.

The counters 17, 22 each possess resetting inputs, to which there is connected a resetting line 25.

Through the employment of the described circuit, the method for monitoring the state or condition of the charge of the battery takes place essentially as follows:

When the battery 1 is fully charged, then the counter 17 stands at an initial high-count condition. As long as none of the users or consuming devices 2, 3, 4 are operatively connected, there is maintained the initial count condition. No pulse is transmitted to the counters 17, 22 through the predivider 13.

When the electrical consumption device 2 is now connected in through the switch 7 by means of the switching circuit 6 then, as a result thereof, there is concurrently activated the memory or storage module 10, so that in the rhythmic cycle applied at the input 14 there is now encountered a number of pulses at the output 15 corresponding to those of the memory module 10. For example, for each second there is generated one pulse. As a result thereof, the count condition of the counter 17 is correspondingly lowered. For example, when the consumption device 2 is switched on for 20 seconds, then the count number or condition is lowered by 20.

When the consumption device 3 is switched in through the predivider 13 by means of the switching circuit 6, then there is concurrently activated the storage or memory module 11. In the rhythmic cycle there are generated pulses at the output 15 and, in the exemplary embodiment, namely twice as many pulses as would be for a closed switch 7 corresponding to device 2, since device 2 and device 3 are in a power consumption of 1:2. When the consumption device 3 is connected in for 20 seconds, then the count condition of the counter 17 is correspondingly lowered by 40. The same is applicable upon closing of the switch 9 to activate device 4 and storage module 12, which applies three times as many pulses at output 15 than for closed switch 7, since device 2 and device 4 are in a power consumption ratio of 1:3. The count condition of the counter 17 is thusly lower in correspondence with the duration of the operative connection and the power outputs of the electrical users or devices 2, 3, 4. When two or more of the consumption devices 2, 3, 4 are simultaneously activated then the count condition is lowered correspondingly at a more intensive rate.

When the final count condition has been reached, for example 0, a signal is then generated at the output 18 of the counter 17, which activates the signal transmitter 19. This is a sign to the user of the appliance that the battery 1 must be replaced, although it momentarily still possesses an adequate charge.

Through the signal which is present at the output 18, the AND gate 16 is blocked by the inverter 20, so that further pulses at output 15 will no longer influence the counter 17. By means of the signal at the output 18 there is concurrently activated the AND gate 21, so that pulses from the output 15 will now be transmitted to the counter 22. The latter is set to an initial count condition which corresponds to the difference between the battery charge which is still present in accordance with the signal of the output 18, and a residual charge, at which there is no longer afforded the ensured operation of the circuitry.

After the activation of the counter 22, due to connection in of the consumption devices 2, 3, 4, there is lowered the count condition of the counter 22 as above described in accordance with counter 17. When the final count condition, for example 0, has been reached, then the main switch 24 is opened across the output 23, so that now the appliance is switched off, and malfunctions are thereby avoided.

After the insertion of a new battery, the counters 17, 22 are again set to the initial count conditions through reset line 25. In the described method it is expedient that neither current nor voltage measurements need to be undertaken. Inasmuch as the capacity of the battery 1 and the power outputs of the consumption devices 2, 3, 4 are known, and the pulsing or rhythmic cycle from switching circuit 6 is available, there can be achieved the correlation to the relationships through the setting of the memory or storage modules 10, 11, 12 and the initial count conditions.

In the example, there is commenced from the initial count condition a downward or backward counting of the counters 17, 22. This has the advantage that the final count condition of zero can be easily evaluated. However, there can also be provided an upward or forward counting. The initial count condition would then be zero.

Pursuant to a modification of the invention, in the described manner there can also be considered the power consumption of the electronic circuit 5 itself. There could also be considered the loss in the charge of the battery 1 in dependence upon time, through a lowering of the count condition dependent upon time which is independent of the consumption devices 2, 3, 4. However, both influences are minor in comparison with the power consumption of the electrical consumption devices 2, 3, 4, so that these influences need not be considered.

Moreover, the power consumption of the signal 19 can also be utilized in the described manner for a corresponding lowering of the initial count condition of the counter 22.

What is claimed is:

1. A method for monitoring the condition of charge of a battery for an appliance, said battery providing power to a plurality of electrical consumption means of the appliance, comprising the steps of: setting a first counter to an initial count condition which is representative of a fully charged condition of the battery; scanning at periodic intervals the plurality of electrical consumption means to determine if power is being supplied to each of the electrical consumption means; changing the count condition of the first counter towards a final count condition in dependence upon the time each electrical consumption means is provided with electrical power and also in dependence upon the power consumption of each electrical consumption means; generating a signal upon reaching said final count condition of the first counter; activating a second counter upon reaching said final count condition of the first counter; changing the count condition of the second counter from an initial count condition towards a final count condition in dependence upon the time each electrical consumption means is provided with electrical power and also in dependence upon the power consumption of each electrical consumption means; and switching off the appliance powered by said battery upon said second counter reaching its final count condition.

2. A method as claimed in claim 1, wherein the final count condition of the first counter is representative of a partially discharged condition of the battery.

3. A method as claimed in claim 2, wherein the final count condition of the second counter is representative 4. Apparatus for monitoring the condition of charge of a battery for an appliance, said battery providing power to a plurality of electrical consumption means, each of said consumption means being connected through respective switches and storage modules to an electronic circuit; said apparatus comprising:
   a first counter which is set to an initial count condition to indicate a fully charged condition of said battery;
   scanning means for scanning the circuit at periodic intervals to determine if power is being supplied to each of said consumption means, said circuit having means for changing said count condition of said first counter towards a final count condition in dependence upon the time each electrical consumption means is provided with electrical power and also in dependence upon the power consumption of each electrical consumption means;
   signal generating means for generating a signal upon reaching said final count condition of the first counter;
   a second counter which is activated at the final count condition of said first counter, said second counter being set at an initial count condition, said second counter being changed from said initial count condition towards a final count condition in dependence upon the time each electrical consumption means is provided with electrical power and also in dependence upon the power consumption of each electrical consumption means; and
   switch means for switching off the appliance when said second count condition of said second counter is reached.

* * * * *

UNITED STATES PATENT AND TRADEMARK OFFICE
CERTIFICATE OF CORRECTION

PATENT NO. : 4,977,393

DATED : December 11, 1990

INVENTOR(S) : Werner Arnold, et al.

It is certified that error appears in the above-identified patent and that said Letters Patent is hereby corrected as shown below:

Column 3, line 35: delete "in"

Column 3, line 44: "method it" should read as --method and apparatus it--

Column 4, line 35, Claim 3: "representative" should read as --representative of a substantially fully discharged condition of the battery.--

Signed and Sealed this

Twenty-eighth Day of April, 1992

Attest:

HARRY F. MANBECK, JR.

*Attesting Officer*     *Commissioner of Patents and Trademarks*